United States Patent
Inoue et al.

(10) Patent No.: US 8,629,529 B2
(45) Date of Patent: Jan. 14, 2014

(54) SEMICONDUCTOR DEVICE AND ITS MANUFACTURING METHOD

(75) Inventors: Naoya Inoue, Tokyo (JP); Ippei Kume, Tokyo (JP); Jun Kawahara, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 624 days.

(21) Appl. No.: 12/519,706

(22) PCT Filed: Dec. 25, 2007

(86) PCT No.: PCT/JP2007/074796
§ 371 (c)(1),
(2), (4) Date: Jun. 17, 2009

(87) PCT Pub. No.: WO2008/078731
PCT Pub. Date: Jul. 3, 2008

(65) Prior Publication Data
US 2009/0309186 A1  Dec. 17, 2009

(30) Foreign Application Priority Data
Dec. 27, 2006 (JP) ................. 2006-353373
Jun. 21, 2007 (JP) ................. 2007-164392

(51) Int. Cl.
*H01L 27/06* (2006.01)

(52) U.S. Cl.
USPC .... 257/533; 257/532; 257/528; 257/E27.024; 438/381

(58) Field of Classification Search
USPC ........... 257/528, E27.024, 532, 533; 438/381
See application file for complete search history.

(56) References Cited

U.S. PATENT DOCUMENTS 6,294,834 B1* 9/2001 Yeh et al. ................. 257/758
7,154,158 B2* 12/2006 Kikuta et al. ............. 257/516

FOREIGN PATENT DOCUMENTS

| JP | 2001223334 A | 8/2001 |
| JP | 2001267320 A | 9/2001 |
| JP | 2002217373 A | 8/2002 |
| JP | 2004-507105 A | 3/2004 |
| JP | 2004140310 A | 5/2004 |
| JP | 2004193602 A | 7/2004 |
| JP | 2004214649 A | 7/2004 |
| JP | 2004343125 A | 12/2004 |
| JP | 2005142531 A | 6/2005 |
| WO | 2006/001349 A1 | 1/2006 |

OTHER PUBLICATIONS

International Search Report of PCT Application No. PCT/JP2007/074796 mailed Mar. 18, 2008.

* cited by examiner

*Primary Examiner* — Stephen W Smoot
*Assistant Examiner* — Vicki B Booker

(57) ABSTRACT

A semiconductor device is produced by fabricating a capacitor element including a lower electrode, a capacitor insulating film, and an upper electrode, and a thin-film resistor element, in the same step. As the lower electrode of the capacitor element is lined with a lower layer wiring layer (Cu wiring), the lower electrode has extremely low resistance substantially. As such, even if the film thickness of the lower electrode becomes thinner, parasitic resistance does not increased. The resistor element is formed to have the same film thickness as that of the lower electrode of the capacitor element. Since the film thickness of the lower electrode is thin, it works as a resistor having high resistance. In the top layer of the passive element, a passive element cap insulating film is provided, which works as an etching stop layer when etching a contact of the upper electrode of the capacitor element.

14 Claims, 11 Drawing Sheets

SEMICONDUCTOR DEVICE AND ITS MANUFACTURING METHOD

This application is the National Phase of PCT/JP2007/074796, filed Dec. 25, 2007, which is based upon and claims the benefit of priority from Japanese patent applications No. 2006-353373 filed on Dec. 27, 2006 and No. 2007-164392 filed on Jun. 21, 2007, the disclosures of which are incorporated herein in its entirety by reference.

TECHNICAL FIELD

The present invention relates to a semiconductor device in which a passive element configured of a capacitor element and a resistor element is incorporated in a semiconductor integrated circuit (LSI). In particular, the present invention relates to a semiconductor device having a passive element including a capacitor element configured of a conductive upper electrode, capacitive insulator, and conductive lower electrode, and a resistor element in the same layer, incorporated in an LSI having a multilayer wiring structure, and to its manufacturing method.

BACKGROUND ART

In an ultra large-scale integrated circuit (ULSI) to be formed on a Si semiconductor substrate, miniaturization of design dimension is always promoted in order to reduce costs, improve performance, and reduce power consumption. Miniaturisation is promoted to increase the number of elements to be integrated to thereby improve the function, and the chip size is reduced to thereby reduce the costs. Alternatively, with improvements in integration, it is possible to mount a plurality of circuit blocks having different functions, and as the number of components is reduced, it is also possible to reduce the costs of a device incorporating the ULSI chip. With a plurality of circuit blocks having various functions being mounted together, not only cost reduction but also additional, improvements in performance such as an improvement in communication speed can be achieved by the combination. Further, as an operating voltage can be reduced by miniaturization, it is also possible to suppress power consumption of a circuit block having the same function.

However, as miniaturization of an active element has been rapidly developed, a new problem arises. Hereinafter, this problem will be summarized in the categories of power supply noise, RF/analog, and power consumption.

First, a problem regarding power supply noise will be described. As miniaturization is promoted, driving voltage is lowered. However, as the number of integrated elements rapidly increases, the amount of electric current to be consumed largely increases. Further, together with miniaturization of elements, the operational frequency continues to rise, and the switching time becomes shorter. This means that the amount of electric current at the time of switching increases, and as the switching period becomes shorter, di/dt which indicates the change in current over time abruptly increases. L·di/dt, calculated by multiplying the change in current over time by the inductance L of the circuit, is voltage fluctuation, which is called simultaneous switching noise. Simultaneous switching noise fluctuates the power supply voltage, and may invert the logic state. With the advance of miniaturization, as the power supply voltage drops as described above and the fluctuation in voltage due to noises increases, noise margin decreases at an accelerated pace. Such noise can be reduced by lowering impedance of the circuit, or power supply fluctuation can be suppressed by adding capacitance to the circuit. Such capacitance is called decoupling capacitance. In a typical ULSI, MOS capacitance which is obtained when a transistor is formed is used as decoupling capacitance. However, development in miniaturization causes a problem that the thickness of an insulating film of a MOS capacitor becomes thinner and leak, current of the insulating film drastically increases. Further, as noise is decreased drastically, the absolute capacitance value is also in short, so that the chip area is tend to be increased due to the decoupling capacitor inserted to stabilise the power supply voltage. In order to avoid this problem, it is necessary to prepare, in the wiring layer, decoupling capacitor using an insulating film having higher permittivity than that of MOS capacitance. By incorporating capacitor in the wiring layer, as it can be arranged while being overlapped with the transistor on a plane, the arrangement area can be taken larger than that of the MOS capacitor. By increasing the permittivity, as the capacitance value in the same area can be larger, it is possible to arrange larger capacitance in a limited area.

Regarding noise prevention in the high-speed operation, not only capacitance but also response has to be considered. Power supply noise in the high-speed operation includes a large amount of high frequency components. In the capacitor element, there are parasitic resistance components of the electrode, which deteriorate response to noises. When the operation speed reaches an area of gigahertz, the effects of parasitic resistance of the electrode become obvious, so that it becomes difficult to sufficiently exhibit the performance of the decoupling capacitor. Accordingly, it is necessary to reduce the electrode resistance as much as possible.

Improvements in the operation speed provided by miniaturization of a MOS active element promote to form. MOS high-frequency (RF) signal processing circuits in MOS devices. If an RF device can be configured of a MOS device, improvements in functions and cost reduction can be realized due to combination with digital base band circuits. Combinations of analog circuits and digital circuits can also provide the same merit. In RF devices and analog devices, passive elements such as resistor elements, capacitor elements, and inductors can be used effectively. As such, it is very important to integrate passive elements in addition to active elements used in the MOS logic. Although MOS logic has been miniaturized by generations, as the characteristics of such passive elements are determined only with the physicality, those elements will not be miniaturised even if their generations advance. As such, the relative area of the passive elements in an ULSI chip increases, which inhibits reduction of chip costs.

Next, a problem considered from the side of power consumption will be described. As miniaturization technique has been developed, electric current handled by respective devices in a chip increases due to improvements in the driving power of transistors, while electric current consumed by the entire chip also drastically increases due to improvements in integration. Consumed electric power is converted into heat by resistance components in the circuit and increases the temperature of the chip. In order to prevent the temperature rise, a temperature sensor is provided in the chip so as to provide a controlling mechanism to reduce the power consumption when the temperature rises. In order to reduce the chip costs, the size of the temperature sensor itself is also needed to be miniaturized.

In the case of a capacitor element, parasitic capacitor formed between an electrode and a silicon substrate is also a problem in the operational characteristics. In miniaturizing ULSI, as it is contracted three-dimensionally because of its structure, a distance between the wiring layer and the silicon substrate becomes closer. At the same time, as the electrode area of the capacitor element becomes relatively larger compared with the circuits around it, the parasitic capacitance formed between the substrate becomes larger. In order to solve this problem, it is desirable to provide a capacitor element having high permittivity at a position distant from the substrate. In other words, it is necessary to provide a capacitor element to the upper layer wiring layer. Further, with an increase in the relative size with respect to the active element, parasitic resistance of the electrode plate cannot be ignored. In high-frequency operation, as the parasitic resistance of the electrode becomes high, response of the capacitor element deteriorates, so that a desired operation will not be performed. Accordingly, it is necessary to reduce the parasitic resistance of the capacitor element as much as possible.

As a resistance element, a silicide film used for a gate electrode of a MOS transistor is used. As a silicide film has higher resistance compared with that of a typical metal film, it has a high value to be used as a resistor element. However, in a leading edge CMOS process, "metal gate" in which a metal film is used as a gate electrode has been gradually introduced, so that it is getting difficult to provide a high resistance film in the CMOS process. Accordingly, in order to provide a resistance element, additional processes are required. In general, in a device using resistor elements, capacitor elements are also required. As such, by fabricating capacitor elements and resistor elements simultaneously, it is possible to prevent a large increase in the number of steps.

As described above, by fabricating resistor elements at the same time as adding capacitor elements in a wiring layer, a number of problems can be solved. However, in order to add such passive element in the wiring, another problem occurs. In the leading edge wiring structure of forming a wiring material mainly made of copper in a low-permittivity inter-layer insulating film, there is a problem of heat-resistance of the insulating film, and the upper limit of the process temperature is 350° C. to 400° C. As such, the temperature for forming a capacitor element is required to be set to have an upper limit of about 350° C. Further, as copper is subjected to diffusion in the insulating film, it is necessary to insert a barrier film for preventing diffusion of the copper between the inter-layer insulating film or the capacitor insulating film and the copper wiring. In view of the above, it is necessary to carefully consider the manufacturing process and the structure of passive elements to be formed within the copper wiring.

Related art regarding structures or manufacturing methods directed to forming passive elements in a wiring layer, which has been disclosed, will be described below.

Patent Document 1 (JP 2004-214649 A) discloses a method of forming a capacitor element and a thin-film resistor element in the same layer. A lower electrode and a capacitor insulating film of the capacitor element are laminated and patterned by photolithography and etching, and then a metal film serving as both an upper electrode film of the capacitor element and the thin-film resistor element is formed. Then, the metal film is patterned, whereby an upper electrode of the capacitor element and a thin-film resistor element are simultaneously formed. This structure can be formed in any via layer.

Patent Document 2 (JP 2001-223334 A) discloses a structure in which a common material is used for a resistor element and a capacitor element in a semiconductor device. First, a lower electrode pattern of a capacitor element is formed, and a capacitor insulating film and a metal layer serving as an upper electrode and a resistor element are deposited. Then, through photolithography and etching steps, the upper electrode of the capacitor element and the resistor element are simultaneously formed.

Patent Document 3 (JP 2004-193602 A) discloses a method, of forming a capacitor element using Cu wiring as a lower electrode and a metal resistor element simultaneously. The Cu wiring is formed by the damascene method, and the Cu wiring itself is used as a lower electrode of the capacitor element. Then, a capacitor insulating film made of silicon nitride or silicon carbide is formed, and then, a metal layer serving as both an upper electrode of the capacitor element and a resistor element is formed. Then, lithography and etching steps are applied to pattern the upper electrode of the capacitor element and the resistor element.

Patent Document 4 (JP 2005-142531 A) discloses, in FIG. 1 and Claim 1 and elsewhere, a semiconductor device including a semiconductor substrate, a capacitor provided on the semiconductor substrate and having a metal upper electrode, a metal lower electrode, and a dielectric body interposed between them, and a resistor structure provided on the semiconductor substrate, in which the resistor structure includes a metal upper electrode, a metal lower electrode, and a dielectric body interposed between them, which are formed together with the capacitor.

Patent Document 1: Japanese Patent Laid-Open Publication No. 2004-214649
Patent Document 2: Japanese Patent Laid-open Publication No. 2001-223334
Patent Document 3: Japanese Patent Laid-open Publication No. 2004-193602
Patent Document 4: Japanese Patent Laid-Open Publication No. 2005-142531

DISCLOSURE OF THE INVENTION

Problems to be Solved by the Invention

However, the related art described above involves the following problems. First, in the art disclosed in Patent Document 1, the lower electrode and the capacitor insulating film of the capacitor element are comprehensively patterned in a first lithography step, and in a second lithography step, the upper electrode of the capacitor element is patterned and a resistor element is simultaneously formed. In this case, lithography steps have to be performed twice. However, when performing a multilayer wiring process, planarization by chemical mechanical polishing (CPM) is performed for each wiring layer, and when performing the first lithography step, alignment using a difference in levels as a mark cannot be performed. Further, as the metal layer serving as the lower electrode does not transmit light, even if a mark for alignment is formed by the metal wiring or the like of the lower layer, it is impossible to perform alignment using it. Accordingly, before forming the metal layer serving as the lower electrode, it is necessary to add a photolithography step of forming a difference in levels using the mark formed by the metal wiring or the like of the lower layer. As such, in the process of forming a passive element, three times of lithography steps are required in total.

Further, in the art described in Patent Document 2, the lower electrode of the capacitor element is patterned in the first lithography step, and in the second lithography step, the upper electrode and the capacitor insulating film of the capacitor element are comprehensively patterned and a resistor element is simultaneously formed. Here, two lithography steps are required. However, due to the same reason as that of Patent Document 1, before forming the metal layer serving as the lower electrode, it is necessary to add a photolithography step of forming a difference in levels using the mark formed by the metal wiring or the like of the lower layer. As such, in the process of forming a passive element, three times of lithography steps are required in total.

Further, in the first and the second art, as the capacitor element is formed in the same layer as the via layer for wiring, it is necessary to form the capacitor element to have a sufficiently thinner laminated structure than that of the via layer. Accordingly, as it is difficult to form the lower electrode to be thick, there is a problem that parasitic resistance of the lower electrode is high. Generally, as a material of the lower electrode, a high-melting point material such as Ti or Ta or its nitride, which are physically hard, and to which plasma etching can be easily applied, is used, such materials have high resistivity, and an increase in the parasitic resistance of the electrode is serious.

Further, the third art described in Patent Document 3 has an advantage of the number of steps being small, and in this third art, as the Cu wiring and the lower electrode are shared, a lithography step of forming the lower electrode can be omitted. Even in the formation of the Cu wiring by the damascene, CMP is also used, and in the lithography step of simultaneously patterning the upper electrode and the resistor element, it is necessary to form a mark used for alignment in the same manner as other examples. As such, a passive element is provided through two lithography steps.

Further, in the third art, the parasitic resistance of the lower electrode of the capacitor element, which is a problem in the first and the second art, is solved. In the third art, Cu wiring having an extremely low resistance value is shared with the lower electrode. As the thickness of the wiring layer is almost the same as that of the via layer, a sufficiently thick lower electrode can be provided, compared with another art requiring a lower electrode which is thinner than that of a via layer. Further, compared with a generally-used electrode made of high-melting point metal, the resistivity of the Cu electrode used herein can be suppressed significantly. As such, in the art described above, it is possible to suppress the parasitic resistance of the capacitor element to an extremely low level.

However, the Cu layer used as the lower electrode has a characteristic of being subjected to diffusion by being ionized in the insulator such as an oxide. As such, an oxide cannot be used as a capacitor insulating film, and it is limited to silicon nitride, silicon carbide, or the like. A metal oxide has high permittivity with respect to these materials, and in order to increase the capacitance value of the capacitor element, introduction of a metal oxide is indispensable, As such, it is difficult to adapt this structure.

Further, all of the first to third art are common in the aspect of sharing the upper electrode of the capacitor element and the resistor element. In order to fabricate a resistor element of high resistance, it is necessary to increase the resistivity of the metal film itself or to mate the film to be thinner. However, if the metal film is made thinner, there is a problem that when a contact hole reaching the resistor element is formed, the metal film is not durable for etching so that the metal itself is completely removed. Further, in the capacitor element having the upper electrode of high resistance, the parasitic resistance becomes higher, and the high-frequency characteristics are deteriorated. In order to suppress an increase in the parasitic resistance of the capacitor element, although it may be possible to line with the wiring layer of the upper layer, if a number of contact holes are formed above the upper electrode fox lining, the capacitor element will be damaged when etching so that the characteristics will be deteriorated. Accordingly, it is extremely difficult to share the resistor element of high resistance and the upper electrode of the capacitor.

Further, in the fourth art of the Patent Document 4, as the capacitor element and the resistor element are formed in the same step, the capacitor upper electrode 17 of the capacitor element and the metal resistor 20 of the resistor element have the same thickness, so that their resistance values are the same. As such, there is a problem that the resistance value is too high for the upper electrode of the capacitor element while the resistance value is too low for the resistor of the resistor element.

It is an object of the present invention to provide a semiconductor device in which even if a lower electrode of a capacitor element and a resistor of a resistor element have the same thickness, the lower electrode and the resistor can have appropriate resistance values respectively, parasitic resistance of the lower electrode of the capacitor element can be reduced, there is no need to form a contact opening to the resistor element, and a passive element can be manufactured through less difficult steps, and to provide a manufacturing method in which resistor elements of high resistance and capacitor elements of low parasitic resistance can be formed simultaneously through a small number of steps.

Means for Solving the Problems

In order to achieve the object, a semiconductor device according to the present invention includes a passive element having a capacitor element and a resistor element. The capacitor element and the resistor element are incorporated in a same layer, an electrode of the capacitor element is formed of a metal film, and the electrode is lined with a wiring layer having a wiring structure. The resistor element is formed of a part of the metal film.

Further, a method of manufacturing a semiconductor device according to the present invention includes; forming, in a laminated manner, a wiring cap insulating film configuring an inter-via layer insulating film having a multilayer wiring structure, and a hard mask insulating film; forming an opening in the hard mask insulating film by photolithography; etching the wiring cap insulating film using, as a mask, the hard mask insulating film with the opening formed therein, and forming first to third openings where a wiring layer of a lower layer exposes; and forming a laminated body including a passive element lower layer metal film, a passive element insulating film, and a passive element upper layer metal film, patterning the laminated body by lithography, and forming a capacitor element in the first opening and forming a resistor element between the second opening and the third opening.

Effects of the Invention

According to the present invention, as the lower electrode of the capacitor element contacts the lower layer wiring layer (for example, Cu wiring layer), it is possible to reduce the parasitic resistance even if the film thickness of the lower metal film configuring the lower electrode is made thin, and as the film thickness of the lower metal film can also be made thin, a sufficiently high resistance value can be obtained even if the resistor element and the capacitor element are formed in the same step. Further, as there is no need to form a contact opening on the resistor element, the process difficulty is lowered. In the lithography step for opening the wiring cap insulating film formed on the lower layer wiring layer, it is possible to perform alignment using a mark formed in the lower wiring layer via the optically transparent wiring cap insulating film, and in this opening step, by forming a mark for alignment to be used when patterning the passive element, the passive element can be provided by adding two lithography steps in total, compared with the case of not providing a passive element.

BEST MODE FOR CARRYING OUT THE INVENTION

Hereinafter, an exemplary embodiment of the invention will be specifically described with reference to the accompanying drawings.

As shown in FIGS. 1, 4, 6, 8, and 9, a semiconductor device according to an exemplary embodiment of the invention is a semiconductor device having a passive element including a capacitor element 55 and resistor elements 56 and 57 as a basic structure. The semiconductor device is characterized in that the capacitor element 55 and the resistor element 57 are incorporated in the same layer, an electrode of the capacitor element 55 is formed of a metal film, the electrode 55 is lined with a wiring layer of a wiring structure, and the resistor element is made of a part of the metal film.

In the exemplary embodiment of the invention, the electrode of the capacitor element is lined with a wiring layer (Cu wiring and the like). As such, as at least a part of the electrode contacts, the wiring layer configures a part of the electrode even if the electrode of the capacitor element is thin, so that the electrode of the capacitor element has sufficiently small electric resistance. On the other hand, as the resistor element is made of part of the metal film configuring the electrode of the capacitor element, the resistor element can be relatively thin as the electrode of the capacitor element is made to be thin, the resistance value can be large.

Next, the exemplary embodiment of the invention will be described in more detail using specific examples.

FIG. 1 is a cross-sectional view showing a passive element portion of a semiconductor device according to a first exemplary embodiment of the invention. On the semiconductor substrate 1, a CMOS transistor layer 71 is formed, and a Cu multilayer wiring layer 72 configured with two or more Cu wiring layers 11 is formed on the CMOS transistor layer 71. The Cu multilayer wiring layer 72 includes wirings 2 configured with a Cu wiring layer 11 and a contact plug 3 connecting the upper and lower wirings 2. The capacitor element 55 and the resistor element 56 are formed on any desired Cu wiring layer 11. On the surface of the Cu wiring layer 11, there is formed an inter-passive element layer insulating film 20 configured of two layers including a wiring cap insulating film 21 for preventing oxidation of the Cu wiring and dispersion of the Cu element, and a hard mask insulating film 22 for opening the wiring cap insulating film 21.

The inter-passive element layer insulating film 20 formed on the Cu wiring layer 11 includes contact portions 45 and 46 connecting the lower Cu wiring layer 11 and the passive element. The passive element is configured of the capacitor element 55 formed of the lower electrode 51 made of a lower metal film, the capacitor element insulating film 52, and the upper electrode 53 made of an upper metal film, and the resistor element 56 made of a lower metal film. These two kinds of passive elements have the same laminated structure. As the lower electrode 51 of the capacitor element is lined with the Cu wiring layer 11 of the lower layer, it has substantially low resistance. As such, even if the film thickness of the lower electrode 51 is made thin, parasitic resistance will not increase. On the other hand, although the resistor element 56 is configured to have the same film thickness as that of the lower electrode 51 of the capacitor element, as the film thickness of the lower electrode 51 can be thin as described above, the resistor element 56 formed of the same metal layer as that of the lower electrode 51 becomes an element having high resistance. Further, on the top layer of the passive element section, there is a passive element cap insulating film 44 working as an etching stop layer when the upper electrode contact of the capacitor element is etched.

The resistor element 56 includes two terminals, both of which are electrically connected to the Cu wiring layer 11 of the lower layer via the contact section 46 formed in the inter-passive element layer insulating film. On the other hand, the capacitor element 55 includes two terminals, in which the lower electrode 51 is electrically connected to the lower wiring layer (Cu) 11 via the contact section 45 formed in the inter-passive element layer insulating film 20, and the upper electrode 53 is connected to the Cu wiring layer 63 of the upper layer via an upper electrode contact via 62 formed in an inter-via layer insulating film 60 formed across the upper parts of the passive element and the inter-passive element layer insulating film. In the contact portion 45 of the capacitor element, the lower electrode (Cu) wiring does not necessarily contact all over the opening. As the Cu wiring is often in a slit shape or in a net shape due to the restrictions in manufacturing the Cu wiring, there is partially a region where Cu wiring does not exist in the bottom part of the contact section 45. Further, as the etching shape of a side wall and that of a bottom corner at the opening end differ in the case where the opening end of the contact section exists on the Cu wiring and in the case where it does not exists on the Cu wiring, it is necessary to control the etching process in accordance with the state of the opening end. Further, as Cu etching is generally difficult and its control is not easy, it is preferable that Cu wiring does not exist in a particular part such as the opening end. However, as it is impossible to completely eliminate the opening end on the CU wiring for connection with external circuits, it is preferable that the ratio of the length of the opening end on the CU wiring to the total extending length of the opening end is set to be less than 50%. Further, the Cu wiring layer 11 of the lower layer is connected with the Cu wiring 63 of the upper layer via a wiring via 61 formed in the inter-passive element layer insulating film 20 and the inter-via layer insulating film 60, and the contact via 62 and the wiring via 61 are formed in the same process.

As the capacitor element 55 is configured such that the lower electrode 51 is lined with the Cu wiring as described above, it is possible to significantly reduce the parasitic resistance. FIG. 10 is a graph, in which the horizontal axis indicates the width of copper wiring of the lower electrode lower layer and the vertical axis indicates lower electrode resistance, showing the effective resistance of the lower electrode when patterns of the lower layer copper wiring 11 are changed. FIG. 10 shows that as the width of the lower copper layer becomes larger, the electrode effective resistance is reduced. Compared with the case of not being lined, the DC-like resistance is reduced by almost one digit by the lining of the lower layer copper wiring. FIG. 11 is a graph, in which the horizontal axis indicates frequencies and the vertical axis indicates effective capacitance, showing a comparison between frequency responses of the capacitor element 55 and that of a typical parallel-plate type capacitor element. A typical parallel-plate-type capacitor is TiN having a film thickness of 140 nm as a lower electrode, and is not at all lined with lower layer Cu wiring. As obvious from FIG. 11, the capacitor structure of the present invention shows response to a higher frequency. This shows that the capacitor structure of the present invention can reduce the parasitic resistance. From the measurement result in high frequency, as a result of extracting high-frequency parasitic parameter, it has been found that the parasitic resistance of a typical parallel-plate-type capacitor element is 6Ω, and the parasitic resistance of the capacitor element according to the exemplary embodiment of the invention is 2Ω, which is reduced to one third. As described above, based on the experimentation, the parasitic resistance reduction effect of the capacitor structure of the exemplary embodiment of the invention has been proved, and it has been also proved that the high-frequency characteristics are also improved.

Next, a method of manufacturing the semiconductor device according to the exemplary embodiment of the invention will be described. FIG. 2(a) to 2(f) are cross-sectional views showing a method of manufacturing the semiconductor device according to the exemplary embodiment of the invention in the order of steps. Although the structure of layers lower than the Cu wiring 11 is not shown, the structure includes a CMOS transistor structure, and a wiring structure composed of multi layers may be formed in some cases. Further, the Cu wiring 11 is formed by dual damascene or single damascene.

First, as shown in FIG. 2(a), in a groove 10a formed in an inter-layer insulating film 10, barrier metal and a Cu seed film is formed by sputtering. Although not shown, the inter-layer insulating film 10 may have a multilayer structure. Then, a Cu film is deposited by electrolytic plating, the groove 10a is completely filled with Cu, and an extra Cu film on the inter-layer insulating film 10 is removed by chemical mechanical polishing (CMP), whereby the wiring 11 buried in the groove 10a is formed. After the CMP, heat treatment is applied at 200 to 400° C. for grain stabilization of the Cu.

Then, as shown in FIG. 2(b), the wiring cap insulating film 21 and a hard mask insulating film 22 are formed allover in order to prevent oxidation and diffusion of the Cu. The wiring cap insulating film 21 may be a SiN film or a SiCN film, and the hard mask insulating film 22 may be a $SiO_2$ film or a SiOCH film, for example.

Next, an opening 30 is formed in the hard mask insulating film 22 through a photolithography or etching step (see FIG. 2(c)). In this step, it is important to stop etching on the wiring cap insulating film 21 using selectivity of dry etching. Further, in order to improve the covering property of a film configuring a passive element which is to be deposited later, the end portion of the opening 30 in the hard mask insulating film 22 is preferably in a tapered shape. After the opening 30 in the hard mask insulating film 22 is formed, photoresist is removed by ashing. In this process, as the Cu surface of the wiring 11 of the lower layer is not exposed, oxidation of CU due to oxygen plasma can be prevented. Then, the wiring cap insulating film 21 is etched using the opening 30 in the hard mask insulating film 22 as a mask, and openings 31 and 32 reaching the Cu surface of the wiring 11 of the lower layer are formed, as shown in FIG. 2(c). Even in this process, the opening end portions of the openings 31 and 32 are preferably in a tapered shape in order to improve the covering property of a film configuring a passive element. The opening 31 forms a contact for a resistor element, and the opening 32 forms a lower electrode contact for a capacitor element.

Then, as shown in FIG. 2(d), a passive element lower layer metal film 41, a passive element insulating film 42, a passive element upper layer metal film 43, and a passive element cap insulating film 44 are sequentially formed. As the passive element lower layer metal film 41, an alloy film including high-melting metal such as Ti, Ta, W, or the like or a metal element thereof, or a nitride film thereof may be used. Further, it is also effective to use a laminated film including a plurality of those films. Further, as the lower layer metal film 41, preventing diffusion of the Cu element is also an important characteristic. A film thickness of the lower layer metal film 41 is between 5 nm to 50 nm. With this thickness, a high-quality passive element can be formed as a high resistance layer. As the passive element insulating film 42, a silicon nitride film having a film thickness of 5 nm or larger is formed by plasma CVD.

As shown in FIG. 3, when the film thickness of the silicon nitride film becomes thinner than 5 nm, the current density becomes higher, so that the applied voltage insulating property drops sharply, whereby sufficient reliability cannot be achieved. As the passive element upper layer metal film 43, an alloy film including high-melting point metal such as Ti, Ta, or W or a metal element thereof, or a nitride film thereof may be used. As the upper layer metal film 43 is exposed to the etching atmosphere when etching is applied to the upper electrode contact of the capacitor element, the film thickness thereof is set to be relatively large such as 20 nm or larger in order to prevent penetration. For the passive element cap insulating film 44, a material such as SiCN or SiN may be used, as the wiring cap insulating film 21.

Next, patterning is applied in one lithography step in the order of the passive element cap insulating film 44, the passive element upper layer metal film 43, the passive element insulating film 42, and the passive element lower layer metal film 41, and as shown in FIG. 2(e), a capacitor element 55 configured with a resistor element 56, a lower electrode 51, a capacitor element insulating film 52, and an upper electrode 53 is formed in a shape of incorporating the openings 31 and 32 in a planar manner. When patterning the capacitor element 55, the passive element cap insulating film 44 is etched using photoresist as a mask, and after removing the photoresist by ashing, the passive element laminated films (passive element upper layer metal film 43, passive element insulating film 42, passive element lower layer metal film 41) are etched using the residual passive element cap insulating film 44 as a mask. Thereby, the resistor element 56 and the capacitor element 55 configured of the lower electrode 51, the capacitor insulating film 52, and the upper electrode 53 is formed. Note that collective etching may be applied from the passive element cap insulating film to the lower layer metal film using a hard mask such as $SiO_2$ film. In that case, the apparent passive element cap insulating film remains in the device as a laminated structure with the hard mask.

Next, as shown in FIG. 2F, a Cu wiring 63 of the upper layer, a contact 62 to the upper electrode of the capacitor element, and an inter-wiring via 61 are formed by single damascene or dual damascene, to thereby compete a passive element group configured of resistor elements and capacitor elements. Regarding the insulating film 60 formed on the passive element, the material of the inter-via layer film formed across the entire area on the passive element cap insulating film and on the inter-passive element layer insulating film in a region without a passive element, and the material of the inter-wiring layer insulating film formed across the entire area on the inter-via layer insulating film may be the same or different. Further, an etching stop film may be inserted between the inter-via layer insulating film and the inter-wiring layer insulating film. The inter-wiring layer insulating film itself may have a multilayer structure when it is necessary in the steps. Accordingly, the inter-layer insulating film 60 is generally configured of a multilayer insulating film. Further, although the contact 62 to the upper electrode of the capacitor element is shallower than the inter-wiring via 61, a cap insulating film such as the passive element cap insulating film 44 or the wiring cap insulating film 21 serving as an etching stopper exists at the bottom at any opening time, so that etching for opening of different depth can be performed without any difficulties. In the etching for opening using photoresist, after the etching is stopped by the etching stopper film, photoresist is removed by being exposed to oxygen plasma and the etching stopper film is removed by overall etching back, whereby the metal connection surface is exposed. The barrier metal and the Cu seed film 65 shown in FIGS. 1 and 2F are the barrier metal and the Cu seed film formed in a groove 10a by sputtering in the step shown in FIG. 2A.

FIG. 4 is a cross-sectional view showing a semiconductor device according to a second exemplary embodiment of the invention. The exemplary embodiment uses the upper metal film 43 (same layer as the upper electrode 53 of the capacitor element) of the passive element as the resistor element 57. By adopting the structure of the exemplary embodiment, the lower electrode 51 of the capacitor element can be as thin as possible, so that it is possible to set the film thickness of the upper electrode 53 to be thick while maintaining the height of the capacitor element itself. Accordingly, penetration margin when opening the contact 64 to the resistor element, which has been a problem, is significantly improved, whereby it is possible to open a contact of the resistor element easily. At the same time, parasitic resistance of the upper electrode of the capacitor element can also be suppressed. Further, in the exemplary embodiment, it is not necessary to make a contact between the lower layer wiring layer (Cu) 11 and the resistor element. In the exemplary embodiment, as the film thickness of the upper electrode is thick as described above, it has lower resistance than that of the lower electrode which can foe thin. However, as a resistor element of the structure shown in the first exemplary embodiment can be fabricated at the same time, two different types of resistor elements can be fabricated at the same time, so that freedom in circuit design increases.

As the lower layer metal film 41 (same layer as the lower electrode 51 of the capacitor element) of the passive element, an alloy film including high-melting point metal such as Ti, Ta, or W or a metal element thereof, or a nitride film thereof may be used. Further, it is also effective to use a laminated film composed of a plurality of those films, and the total film thickness is 5 to 50 nm. At this time, the uppermost surface is Ta or TaN, and by applying an oxidation process, TaO is formed as the insulating film 42 for the passive element. The oxidation process was performed at the substrate temperature of 350° C. in a gas atmosphere including $N_2O$ at 2.7 Torr, and high frequency electric power was applied for five minutes.

FIG. 5 is a graph showing high-frequency electric power dependency of the capacitance value, in which the horizontal axis indicates high-frequency electric power and the vertical axis indicates capacitance density. For example, when electric power of 500 W is applied, capacitance density of 5 $fF/\mu m^2$ is obtained in 5 minutes. In order to obtain capacitance density of 20 $fF/\mu m^2$ in this condition, treatment is needed to be performed for only 75 seconds. In this way, by adopting plasma oxidation treatment, oxidation treatment can be performed in a short period. Further, by oxidising the surface of the metal electrode, as the oxidation film thickness can be easily controlled in the present method, it is possible to form an insulating film which is excellent in in-face uniformity. Although an example of using Ta oxide has been shown, oxide of Zr, Al, Hf, or the like may be used. A method of acquiring such a metal oxide is not limited to plasma oxidation treatment, and an oxidation treatment using thermal oxidation of a metal film or anodic oxidation reaction can also be applied. Further, it is not limited to oxidation of a metal film.

A metal oxidation film can be directly formed by means of reactive sputtering, chemical vapor deposition, or the like.

As the passive element upper layer metal film 43, an alloy film including high-melting point metal such as Ti, Ta, or W or a metal element thereof, or a nitride film thereof may be used. As the upper layer metal film 43 is exposed to an etching atmosphere when the upper electrode contact of the capacitor element is etched, the film thickness thereof is set to be relatively thick of 20 nm or larger in order to prevent penetration. The passive element cap insulating film 44 may be formed using a material such as SiCN, SiN, or the like, as the wiring cap insulating film 21.

Next, a third exemplary embodiment of the invention will be described. FIG. 6 is a cross-sectional view showing a semiconductor device of the exemplary embodiment. The exemplary embodiment is an example in which the first exemplary embodiment and the second exemplary embodiment are combined to be one element. The capacitor element 55 has the same structure as that of the first and the second exemplary embodiments. As a resistor element, both the first resistor element 55 using the passive element lower layer metal film and the second resistor element 57 using the passive element upper layer metal film are used. With this configuration, as two different resistor elements exist in the same planner region, the area usage efficiency of the passive element is improved. By connecting them in parallel, they can be used as a third resistor element in addition to the resistor element 56 and the resistor element 57.

Next, a fourth exemplary embodiment of the invention will be described. In the exemplary embodiment, a differential signal is transmitted through the resistor element 56 and the resistor element 57 in a semiconductor device having the structure shown in FIG. 6, whereby in-phase noise such as disturbance is removed, and signal propagation can be realized without deteriorating the quality of the signal. As such, it can also be used, as another device.

Next, a fifth exemplary embodiment of the invention will be described. The exemplary embodiment relates to another application of a semiconductor device having the structure shown in FIG. 6. In the resistor element of the structure shown in FIG. 6, the contacts 64a and 64b of the resistor element 57 are connected to the ground potential, and a signal is input from the contact 46a of the other resistor element 56 and is output from the contact 46b of the other end, for example. The equivalent circuit in this case is a distributed constant circuit as shown in FIG. 7. This equivalent circuit is a series-connected circuit of a low-pass filter configured of a capacitor element and a resistor element, and the element also works as a low-pass filter as a whole. In this way, it is possible to fabricate a device which works as a circuit block in one element, together with the capacitor element and the resistor element.

Next, a sixth exemplary embodiment of the invention will be described. In the capacitor element of the exemplary embodiment, as a ceramic material in which the capacitance value largely varies due to temperature changes is used as a capacitor element insulating film, the exemplary embodiment can be used as a temperature sensor of a small type. Further, it is also possible to configure a temperature sensor using temperature dependency of leak current flowing through the capacitor element. Furthermore, it is also possible to utilise a temperature sensor using temperature dependency of resistance values of the resistor element. By selectively mounting any of these three types of temperature sensors while considering a temperature area to be used, accuracy, size, and the like and by controlling power source of an overheated portion, it is possible to prevent excessive temperature rise of a chip and wasteful power consumption.

Next, a seventh exemplary embodiment of the invention will be described. FIG. 8 is a cross-sectional view showing a semiconductor device of the exemplary embodiment. The exemplary embodiment is another exemplary embodiment of the case where the passive element lower layer metal film is used as the resistor element 56. The device includes second and third openings (contacts 46) connected to the resistor element 56 and the lower layer Cu wiring layer 11, and the resistor element 56 is formed by making an opening widely in the inter-passive element layer insulating film 20. As such, the opening portion for the passive element in the inter-passive element layer insulating film 20 and the second and the third openings for the wiring 11 (contact 46) substantially exist in one continued opening. Within this opening, there is no part where the lower layer Cu wiring layer 11 and the resistor element 56 contact each other in a region other than the contact section 46, so that the resistor element 56 can be used as a high resistor element.

Next, an eighth exemplary embodiment of the invention will be described. FIG. 9 is a cross-sectional view showing a semiconductor device of the exemplary embodiment. The exemplary embodiment is a variation of the seventh exemplary embodiment. A part of the lower portion of the resistor element 56 in the seventh exemplary embodiment contacts the lower layer Cu wiring layer 56a, which effectively reduces the lower electrode resistance. By partially reducing the resistance of the resistor element 56 having an appropriate length, the resistance value of the resistor element can be adjusted as a whole.

Next, another exemplary embodiment of the invention will be described. A semiconductor device having the passive element according to the exemplary embodiment of the invention has a multilayer wiring structure including a plurality of wiring layers laminated with an inter-via layer insulating film between each other, and a via formed in the inter-via layer insulating film so as to connect the above and below wiring layers. The semiconductor device includes an inter-passive element layer insulating film configured with one of the inter-via layer insulating films, first to third openings formed in the inter-passive element layer insulating film, a capacitor element formed in a region including the first opening, and a resistor element formed in the second and the third openings and between the second and the third openings. The capacitor element is configured of layer films including a lower metal film contacting the whole area of the wiring portion of the lower layer exposed to the first opening as a lower electrode, a capacitor insulting film formed on the lower electrode, and an upper metal film formed on the capacitor insulating film as an upper electrode. The resistor element has the same layer configuration as that of the capacitor element, and the lower metal film thereof may contact the two wiring layers of the lower layer exposed to the second and the third openings so that the portion between them may configure a resistor.

In the semiconductor device having this passive element, it is preferable to include an upper resistor element in which the upper metal film is a resistor. Further, it is also preferable that the upper electrode and the lower electrode of the capacitor element are formed, in the same shape in a plan view. Further, the inter-passive element layer insulating films may be a laminated body of a wiring cap insulating film for preventing oxidation of the lower layer wiring layer and dispersion of the constituent elements, and a hard mask insulating film. In that case, the wiring cap insulating film, may be made of a material selected from a group consisting of SiN, SiCN, and SiC, and the hard mash may be made of a material selected from a group consisting of $SiO_2$ and SiCOH. Further, it is preferable that the side edges of the first to the third openings are inclined.

It is preferable that on the upper metal film of the capacitor element and the resistor element, a passive element cap insulating film in the same shape in a plan view as that of the metal film is formed. Further, the capacitor insulating film may foe a silicon nitride film having a film thickness of 5 nm or more, or a metal oxide film, for example. It is also preferable that the film thickness of the lower layer metal film is thinner than the film thickness of the upper layer metal film. The resistor element can be connected to a peripheral circuit via the lower layer wiring layer connected in the second and the third openings. The upper resistor element can be connected to the upper layer wiring layer via a contact via which is formed in the inter-via layer insulating film between the upper metal film and the upper layer wiring layer. It is acceptable to be configured that a differential signal is input to one of the resistor element and the upper resistor element, and that a propagated signal is output from the other. In that case, it is acceptable that one of the resistor element and the upper resistor element may be a ground potential, and a signal is input to one terminal of the other, and the signal is output from the other terminal.

A method of manufacturing a semiconductor device having the passive element structure according to the exemplary embodiment of the invention may include, forming a laminated layers of a wiring cap insulating film configuring an inter-via layer insulating film of a multilayer wiring structure and a hard mask insulating film, forming an opening in the hard mask insulating film by photolithography, etching the wiring cap insulating film using the hard mask insulating film with the opening formed therein as a mask thereby forming first to third openings in which a wiring layer of the lower layer is exposed, forming a laminated body including a passive element lower layer metal film, a passive element insulating film, and a passive element upper layer metal film, and patterning the laminated body by photolithography thereby forming a capacitor element in the first opening and a resistor element between the second and the third openings.

In the exemplary embodiment of the invention, described above, as the lower electrode of the capacitor element contacts the lower wiring layer (Cu wiring, etc.) exposed in the first opening in the overall area of the wiring portion exposed in the first opening, the effective lower electrode of the capacitor element is configured of both the lower electrode made of a lower metal film and the lower layer wiring layer. As such, even if the lower metal film is thin, as the lower layer wiring layer configures a part of the lower electrode, electrical resistance of the effective lower electrode of the capacitor element becomes sufficiently small. On the other hand, in the resistor element, as the lower metal film is formed on the inter-passive element layer insulating film and contacts the lower layer wiring layer in the second opening and the third opening, the resistor in the resistor element is formed of the lower metal film between the contacts in the second opening and the third opening. In this case, as the lower metal film can be relatively thin as described above, the resistance value can be large. In this way, in the present invention, the lower metal film can be used as a lower electrode in the capacitor element and used as a resistor in the resistor element. Further, in the capacitor element, as the lower metal film is lined with the lower layer wiring layer and the effective lower electrode is configured of the lower electrode made of the lower metal film and the lower layer wiring layer which is also used as a wiring function, the parasitic resistance in the lower electrode can be reduced. In the resistor element, as the lower metal film contacts the lower layer wiring layer in the second and the third openings to form a resistor, there is no need to open a contact on the resistor element, so that difficulty in the manufacturing step is reduced.

Further, as the lower metal film is formed such that the first to third openings formed by opening the wiring cap insulating film for preventing oxidation/diffusion configuring the inter-passive element layer insulating film is included in a plan view, the lower layer wiring layer (e.g., Cu wiring layer) is completely covered with either the lower electrode or the wiring cap film which prevents oxidation of the wiring material of the lower layer wiring layer and prevents diffusion of the constituent elements of the lower layer wiring layer. As such, oxidation and diffusion of the lower layer wiring can be reliably prevented.

Further, in the lithography step for opening the wiring cap insulating film for preventing oxidation/diffusion formed on the lower layer wiring layer, it is possible to make an alignment using a mark formed on the lower layer wiring layer via an optically transparent insulating film for preventing oxidation/diffusion. As a mark for alignment to be used when the passive element is patterned is simultaneously formed in this opening step, the passive element can be mounted by adding two times of lithography in total.

While the present invention has been described with reference to the embodiments (and examples), the present invention is not limited to those embodiments (and examples) described above. Various changes in form and details which can be understood by those skilled in the art may be made within the scope of the present invention.

This application is based upon and claims the benefit of priority from Japanese patent applications No. 2006-353373 filed on Dec. 27, 2006 and No. 2007-164392 filed on Jun. 21, 2007, the disclosures of which are incorporated herein in its entirety by reference.

Figure 1:
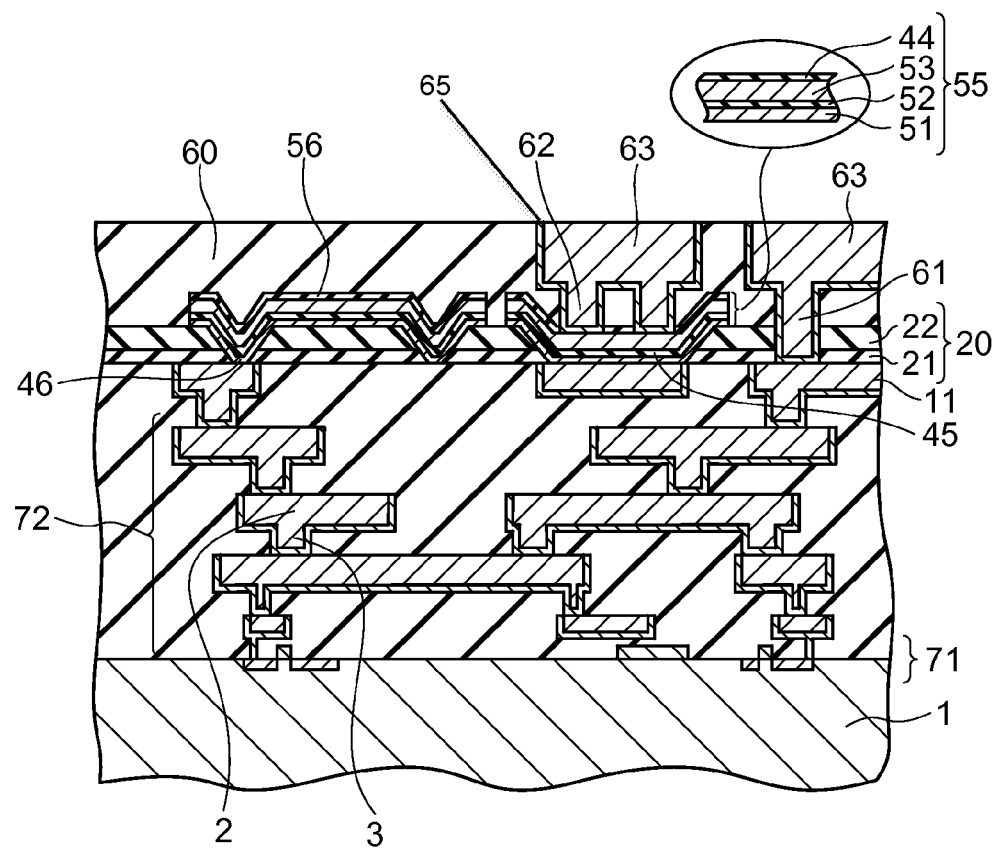
FIG. 1 is a cross-sectional view showing a semiconductor device having a passive element according to the first exemplary embodiment of the invention.
Figure 2A:
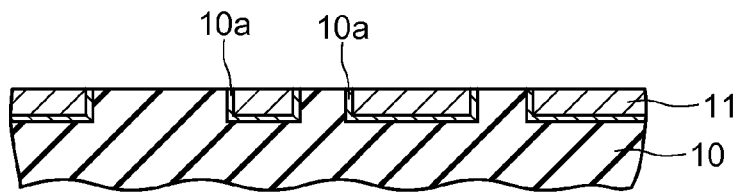
FIG. 2 is a cross-sectional view showing a method of manufacturing the semiconductor device according to the first exemplary embodiment of the invention in the order to steps.
Figure 2B:
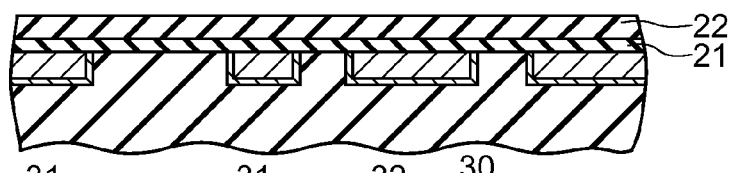
Figure 2C:
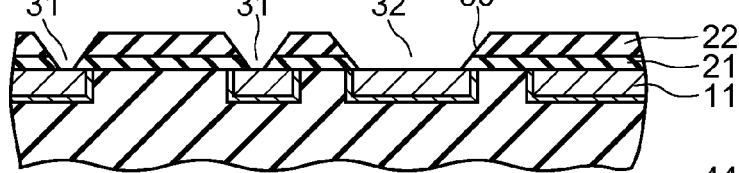
Figure 2D:
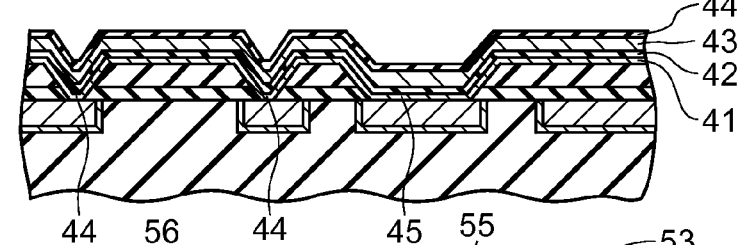
Figure 2E:
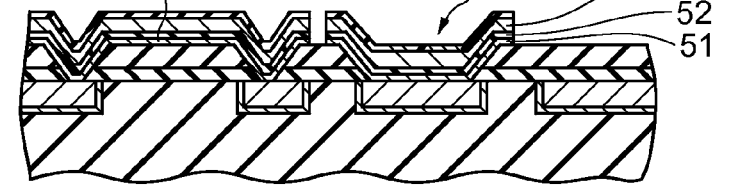
Figure 2F:
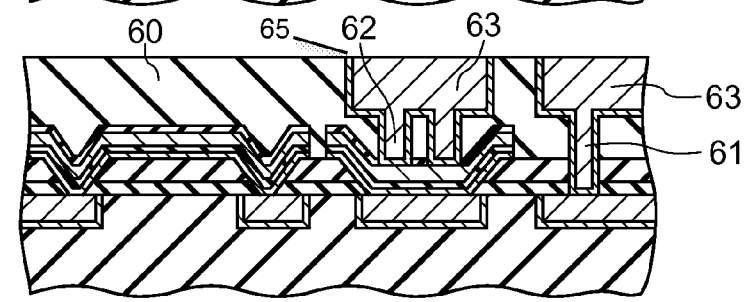
Figure 3:
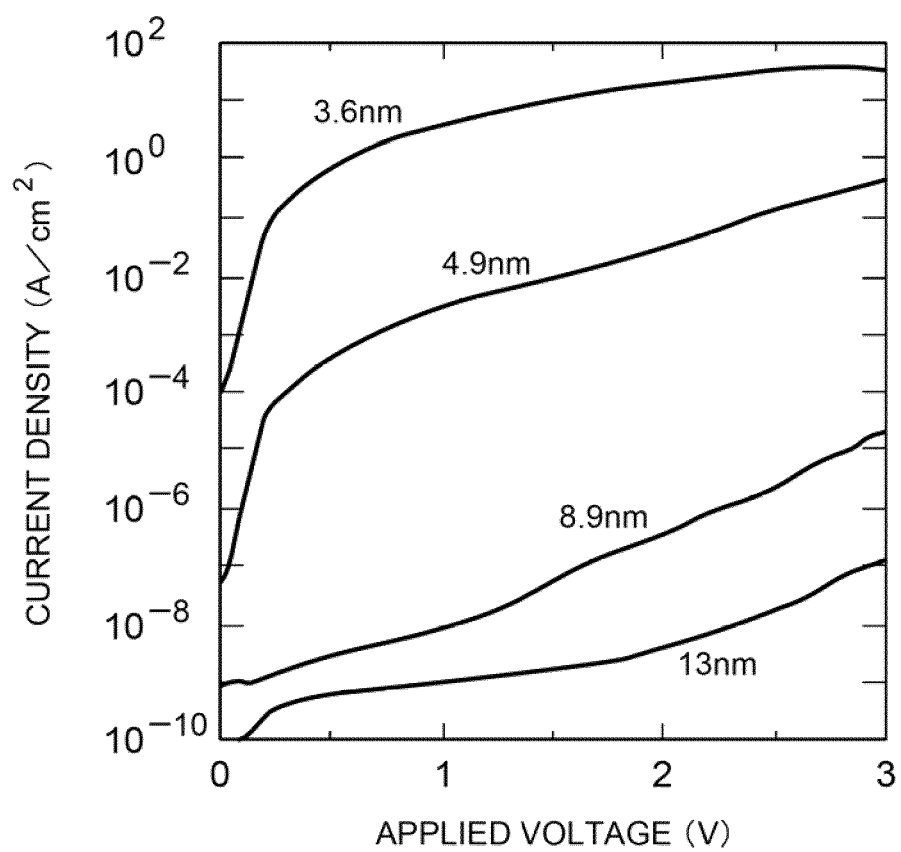
FIG. 3 is a graph showing the relationship between leak current (current density relative to applied voltage) and a film thickness of silicon nitride in a capacitor element in which a capacitor insulating film is made of silicon nitride, in the first exemplary embodiment of the invention.
Figure 4:
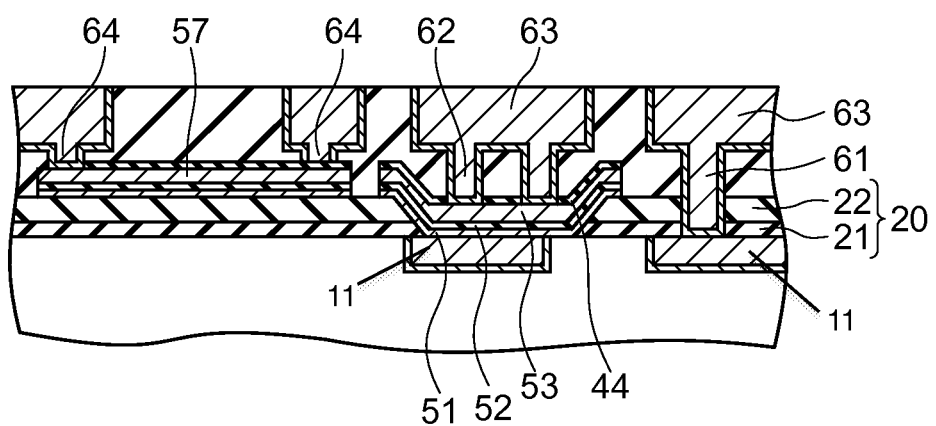
FIG. 4 is a cross-sectional view showing a semiconductor device according to the second exemplary embodiment of the invention.
Figure 5:
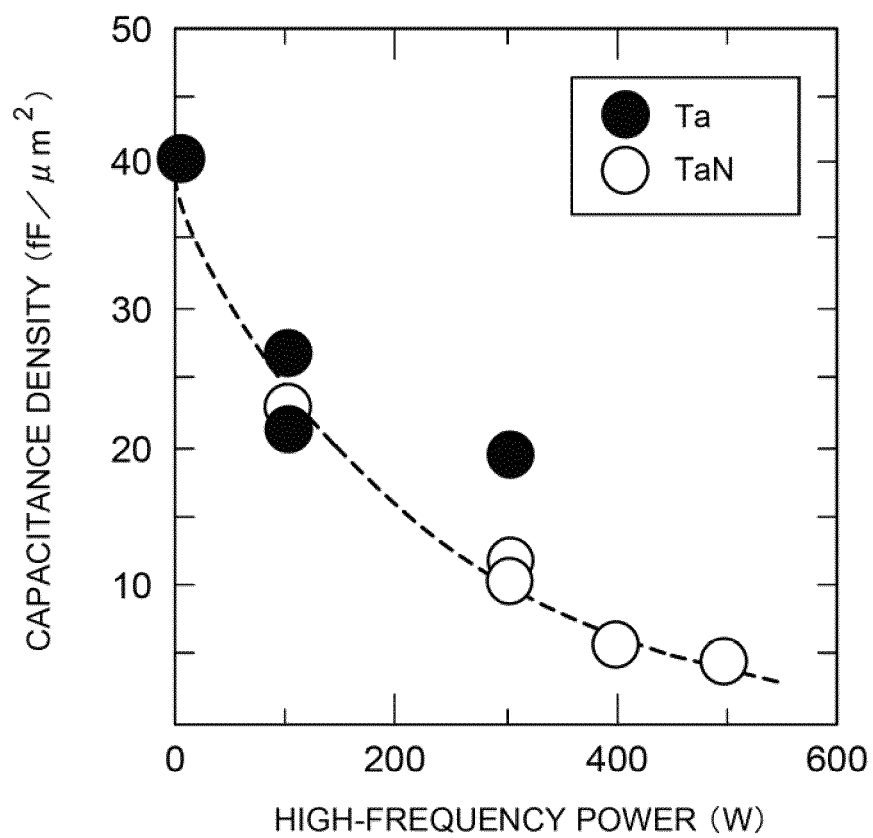
FIG. 5 is a graph showing the relationship between capacitance density when Ta and TaN are oxidized by plasma oxidation and plasma high-frequency electric power, in the second exemplary embodiment of the invention.
Figure 6:
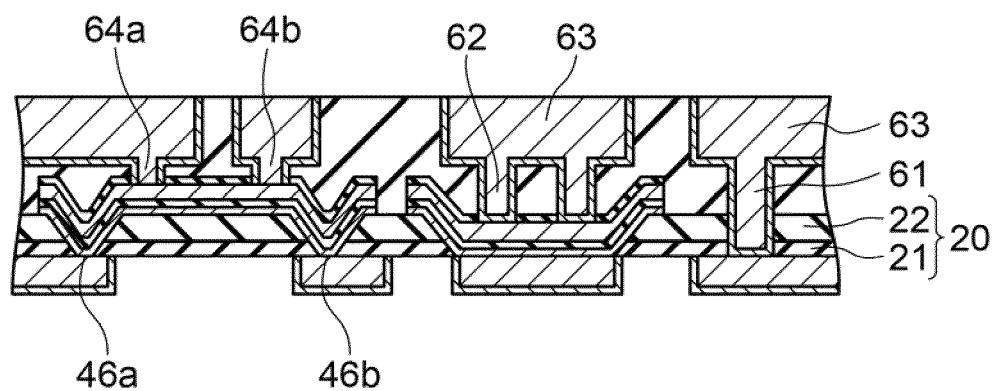
FIG. 6 is a cross-sectional view showing a semiconductor device according to the third exemplary embodiment of the invention.
Figure 7:
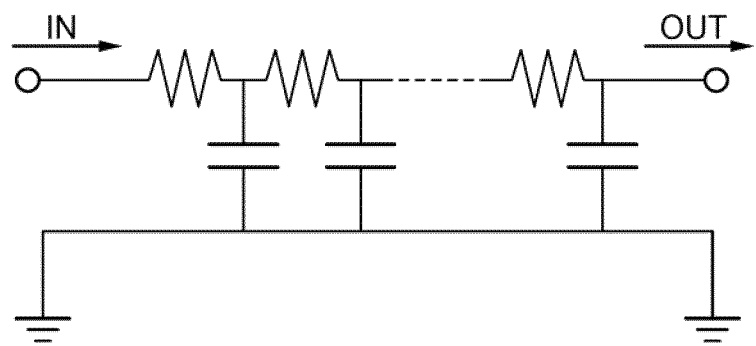
FIG. 7 is a diagram showing an equivalent circuit of a semiconductor device according to the fifth exemplary embodiment of the invention.
Figure 8:
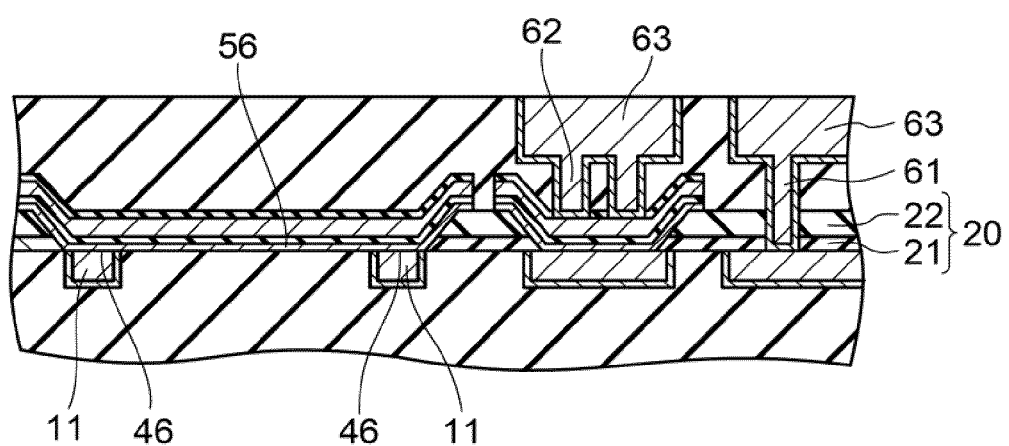
FIG. 8 is a cross-sectional view showing a semiconductor device according to the seventh exemplary embodiment of the invention.
Figure 9:
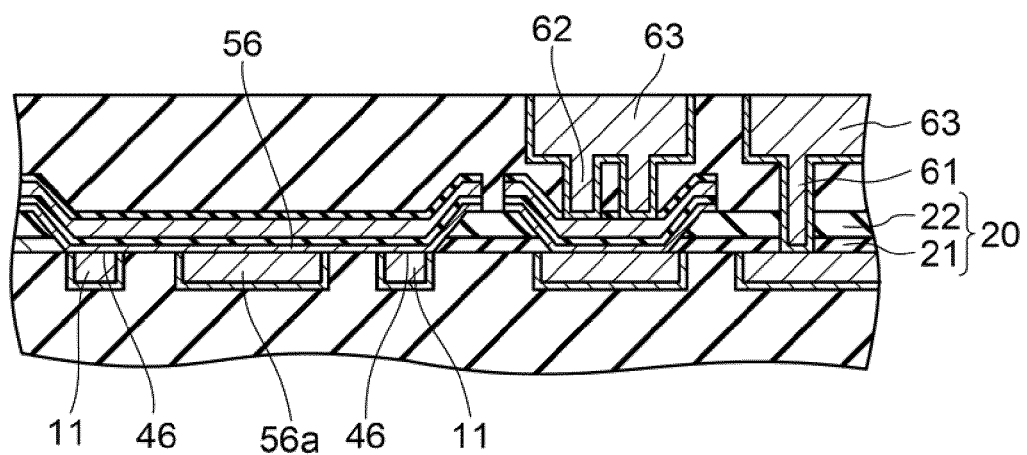
FIG. 9 is a cross-sectional view showing a semiconductor device according to the eighth exemplary embodiment of the invention.
Figure 10:
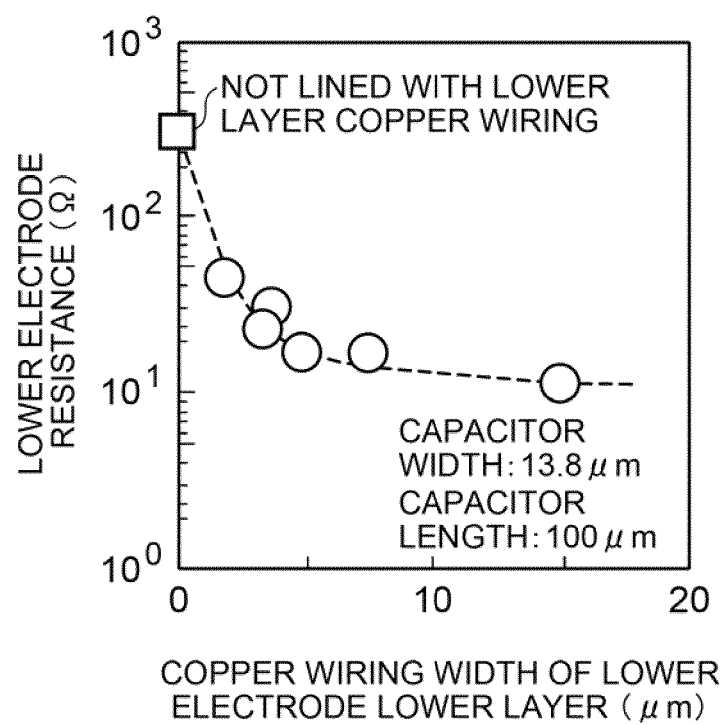
FIG. 10 is a diagram showing measurement results of effective resistance of the capacitor element according to the first exemplary embodiment of the invention.
Figure 11:
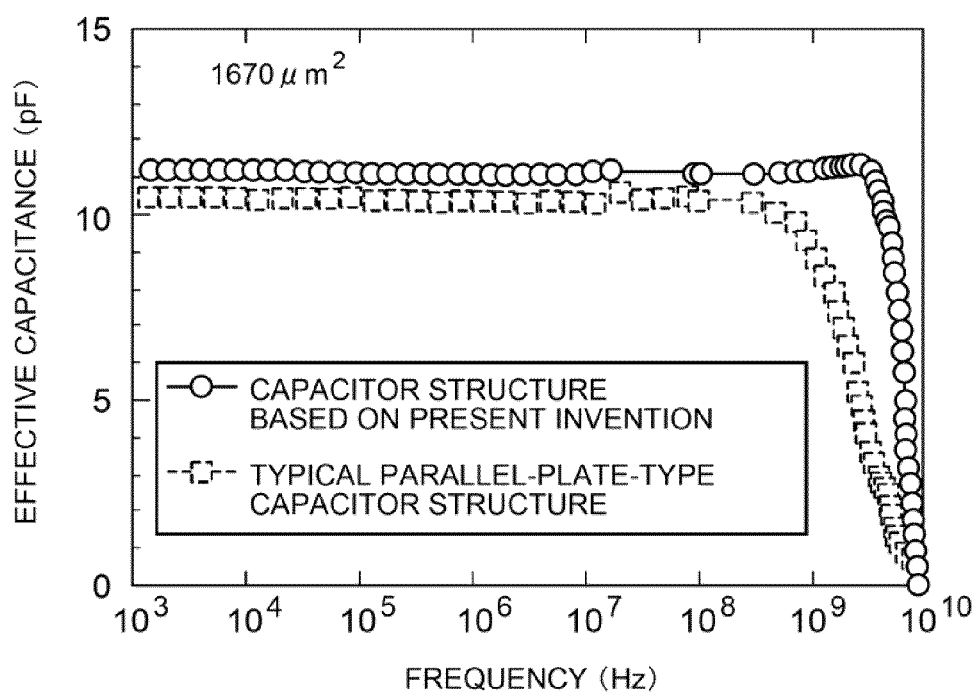
FIG. 11 is a diagram showing frequency response of capacitance value of the capacitor element according to the first exemplary embodiment of the invention.

DESCRIPTION OF REFERENCE NUMERALS 10 inter-layer insulating film of lower layer wiring layer
11 lower layer wiring
21 wiring cap insulating film
22 hard mask insulating film
31 first contact hole for resistor element
32 trench for forming capacitor element
41 passive element lower layer metal film
42 passive element insulating film
43 passive element upper layer metal film
44 passive element cap insulating film
45 capacitor element lower electrode contact
46 first resistor element contact
51 lower electrode of capacitor element
52 capacitor insulating film
53 upper electrode of capacitor element
55 capacitor element
56 first resistor element
57 second resistor element
61 inter-wiring via
62 upper electrode contact via
63 Cu wiring on passive element upper layer
64, 64a, 64b second contact for resistor element
65 barrier metal and Cu seed film
71 CMOS transistor layer
72 multilayer wiring layer

The invention claimed is:

1. A semiconductor device, comprising a passive element including a capacitor element and a resistor element, within a wiring structure, wherein
the capacitor element and the resistor element are incorporated in a same layer,
the wiring structure is a multilayered wiring structure including a plurality of wiring layers laminated with an inter-via layer insulating film between each other, and a via provided in the inter-via layer insulating film and connecting the wiring layers provided above and below,
the capacitor element is sandwiched between an upper electrode and a lower electrode which are metal films, the lower electrode is lined with one of the wiring layers,
the resistor element is formed of a part of the upper electrode, the resistor element includes an inter-passive element layer insulating film formed of one of the inter-via layer insulating films and a first opening formed in the inter-passive element layer insulating film,
the capacitor element is formed in a region including the first opening, and
at least a part of the lower electrode of the capacitor element directly contacts a wiring section of a lower layer through the first opening.

2. The semiconductor device, according to claim 1, wherein
the wiring structure has an inter-passive element layer insulating film formed of the one inter-via layer insulating films and second and third openings formed in the inter-passive element layer insulating film, and the resistor element is formed in the second opening and the third opening and between the second opening and the third opening, the capacitor element is configured of layer films including:
 a lower metal film, as the lower electrode, contacting an entire area of a wiring section of an lower layer exposed to the first opening;
 a capacitor insulating film formed on the lower electrode; and
 an upper metal film, as an upper electrode, formed on the capacitor insulating film, and the resistor element has an identical layer configuration of that of the capacitor element, and a lower metal film thereof contacts two wiring layers of lower layers exposed to the second opening and the third opening such that a portion between them forms a resistor.

3. The semiconductor device, according to claim 2, wherein the inter-passive element layer insulating film is a laminated body of a wiring cap insulating film which prevents oxidation of a lower wiring layer of the wiring layers and diffusion of its constituent element, and a hard mask insulating film.

4. The semiconductor device, according to claim 3, wherein the wiring cap insulating film is made of a material selected from a group consisting of SiN, SiCN, and SiC, and the hard mask is made of a material selected from a group consisting of $SiO_2$ and SiCOH.

5. The semiconductor device, according to claim 2, wherein the first, second, and third openings are formed such that side edges thereof are inclined.

6. The semiconductor device, according to claim 2, wherein the capacitor insulating film is a silicon nitride film having a film thickness of 5 nm or larger.

7. The semiconductor device, according to claim 2, wherein the capacitor insulating film is a metal oxide film.

8. The semiconductor device, according to claim 2, wherein a film thickness of the lower metal film is thinner than a film thickness of the upper metal film.

9. The semiconductor device, according to claim 2, wherein the resistor element is connected to a peripheral circuit by a lower wiring layer connected in the second opening and the third opening.

10. The semiconductor device, according to claim 1, further comprising an upper resistor element in which the upper metal film serves as a resistor, the upper resistor element being the resistor element.

11. The semiconductor device, according to claim 1, wherein the resistor element is an upper resistor element that is connected to the upper wiring layer using a contact via formed in an inter-via layer insulating film between the upper metal film and an upper layer wiring layer of the wiring layers.

12. The semiconductor device, according to claim 1, wherein a differential signal is input to one of the resistor element and the upper resistor element, and a propagated signal is output from another element.

13. The semiconductor device, according to claim 12, wherein one of the resistor element and the upper resistor element serves as ground potential, and a signal is input to one terminal of another element and the signal is output from another terminal.

14. A method of manufacturing a semiconductor device, comprising:

forming, in a laminated manner, a wiring cap insulating film configuring an inter-via layer insulating film having a multilayer wiring structure including a plurality of wiring layers laminated with the inter-via layer insulating film between each other, and a via provided in the inter-via layer insulating film and connecting the wiring layer provided above and below, and a hard mask insulating film;

forming an opening in the hard mask insulating film by photolithography;

etching the wiring cap insulating film using, as a mask, the hard mask insulating film with the opening formed therein, and forming first to third openings where a wiring layer of a lower layer exposes;

forming a laminated body including a passive element lower layer metal layer, a passive element insulating film, and a passive element upper layer metal layer, patterning the laminated body by lithography, and forming a capacitor element in the first opening and forming a resistor element between the second opening and the third opening, wherein the capacitor element and the resistor element are in a same layer;

forming an upper layer and a lower layer which are metal films in such a manner that the upper layer and the lower layer sandwich the capacitor element;

lining the lower electrode with the wiring layer, wherein at least a part of the lower electrode directly contacts a wiring section of a lower layer through the first opening;

forming an inter-passive element layer insulating film formed of one of the inter-via layer insulating films, and forming the first opening in the inter-passive element layer insulating film.

* * * * *